United States Patent [19]

Kayalioglu

[11] 4,071,781
[45] Jan. 31, 1978

[54] PULSE DURATION CORRECTION CIRCUIT

[75] Inventor: Inanc Kayalioglu, Ottawa, Canada

[73] Assignee: Northern Telecom Limited, Montreal, Canada

[21] Appl. No.: 741,791

[22] Filed: Nov. 15, 1976

[51] Int. Cl.² .............................................. H03K 1/18
[52] U.S. Cl. ................................... 307/265; 307/358; 307/313; 328/127; 328/147; 328/163
[58] Field of Search .............. 307/265, 266, 267, 358, 307/313; 328/146, 147, 148, 149, 127, 162, 163

[56] References Cited

U.S. PATENT DOCUMENTS

| 3,502,993 | 3/1970 | Schurzinger et al. | 307/358 |
| 3,610,956 | 10/1971 | Berlin et al. | 328/147 X |
| 3,800,167 | 3/1974 | Smith | 307/265 |
| 3,883,756 | 5/1975 | Dragon | 307/265 |
| 3,971,995 | 7/1976 | Eikelberger | 328/149 |
| 3,991,379 | 11/1976 | Chadwick et al. | 307/358 X |

OTHER PUBLICATIONS

IBM Tech. Disclosure Bulletin, vol. 15, No. 4, 9/1972, pp. 1138–1139, "Dynamic Threshold Circuit" by Rackl, 307-358.

Primary Examiner—John S. Heyman
Attorney, Agent, or Firm—Achmed N. Sadik

[57] ABSTRACT

A pulse duration correcting circuit comprising a comparator and a bipolar averaging circuit for correcting the duration of incoming pulses to a desired standard value is disclosed.

7 Claims, 3 Drawing Figures 4,071,781

PULSE DURATION CORRECTION CIRCUIT

FIELD OF THE INVENTION

The present invention relates to pulse circuits and more particularly to dial pulse correction circuits.

BACKGROUND AND PRIOR ART OF THE INVENTION

In a previous patent by the same inventor titled "NOISE PULSE REJECTION CIRCUIT" issued July 2, 1974 as U.S. Pat. No. 3,822,385, a circuit was disclosed comprising an operational amplifier having a controlled RC network at its inverting input. Such circuit is useful in rejecting pulses having a duration smaller than a predetermined value and as such is utilized as a noise pulse rejector. There are certain applications in which it is required to correct pulses of non-standard duration rather than to reject them. It is for instance often necessary, after noise pulses have been rejected by a circuit similar to that of the above-mentioned patent, to correct the durations of the true pulses and convert them to the standard duration of the respective system.

More specifically in the case of the dial pulse correction, the dial pulses are usually distorted after traversing a transmission medium, such as cable, connecting a transmit and a receive point. The distortion of interest in the present context is a shorting or a lengthening of the original duration of the transmitted pulses. If not corrected, such distortion may result in an error in the telephone number that has been transmitted.

SUMMARY OF THE INVENTION

The present invention, therefore, provides a circuit to correct the duration of transmitted pulses by utilizing the fact that short as well as long pulses cause the average d-c potential of transmitted pulse groups to deviate from its reference value. This fact is utilized by the circuit developing the voltage average of the incoming pulses and feeding it (in lieu of a fixed reference voltage as was done in the circuit of the above-mentioned patent) to one input of a comparator, the other input of which received the incoming pulses.

Accordingly, the pulse correcting circuit comprises: a comparator having two inputs, a predetermined one receiving the incoming pulses through resistive circuit means, and the other receiving the incoming pulses through a bipolar averaging circuit; the output of said comparator being the output of the pulse correcting circuit.

The averaging circuit is bipolar because the incoming pulses may be both positive and negative going with respect to the reference voltage of the circuit.

BRIEF DESCRIPTION OF THE DRAWINGS

A preferred embodiment of the present invention will now be described in conjunction with the accompanying drawings in which.

DETAILED DESCRIPTION OF THE PREFERRED EMBODIMENT

Figure 1:
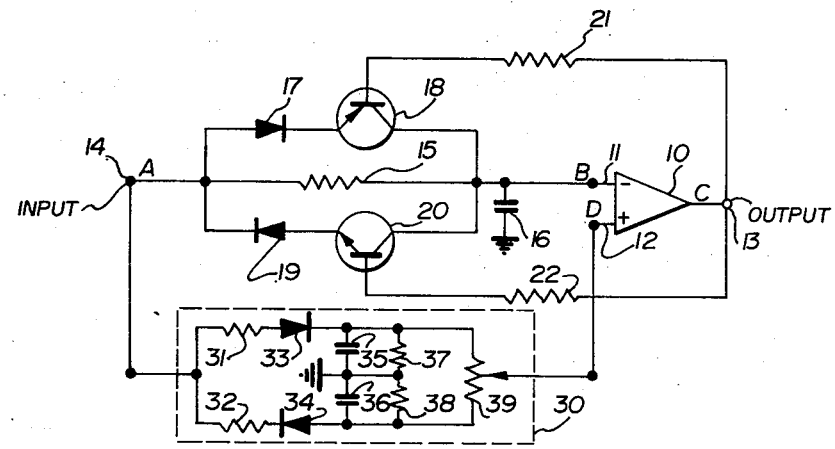
FIG. 1 is a detailed schematic of a pulse correcting circuit according to the present invention.

FIG. 1 shows a comparator 10 having an inverting input 11, a non-inverting input 12, and an output 13. The inverting input 11 is connected to an input terminal 14 through a resistance element 15 and to ground through a capacitor 16. A diode 17 has its anode connected to the input terminal 14 and its cathode connected to the emitter electrode of PNP transistor 18 whose collector electrode is connected to the inverting input 11 of the comparator 10. Similarly, a diode 19 has its cathode connected to the input terminal 14 and its anode connected to the emitter electrode of a NPN transistor 20, whose collector electrode is connected to the inverting input 11 of the comparator 10. The base electrodes of the transistors 18 and 20 are connected via resistors 21 and 22, respectively, to the output 13 of the comparator 10, which is also the output of the pulse correction circuit. The non-inverting input 12 of the comparator 10 is connected to the input terminal 14 through a voltage averaging circuit 30.

The voltage averaging circuit shown in FIG. 1 comprises two resistors 31 and 32 connected together at one terminal of each with the input terminal 14. The other terminal of the resistor 31 is connected to the anode of a diode 33, the cathode of which is connected to a capacitor 35, a resistor 37 and one fixed terminal of a potentiometer 39. The other terminals of the capacitor 35 and the resistor 37 are connected to ground. The other terminal of the resistor 32 is connected to the cathode of a diode 34, the anode of which is connected to a capacitor 36, a resistor 38 and the other fixed terminal of the potentiometer 39. The other terminals of the capacitor 36 and of the resistor 38 are connected to ground. The wiper of the potentiometer 39 is the output of the averaging circuit and is connected to the non-inverting input 12 of the comparator 10.

Figure 2:
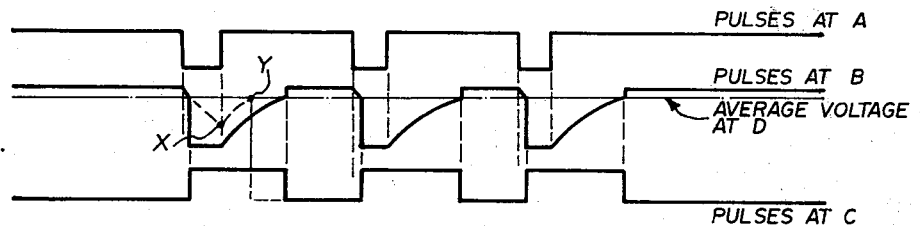
FIG. 2 is an illustration of the corrective action of the circuit in FIG. 1 for too short duration pulses.
Figure 3:
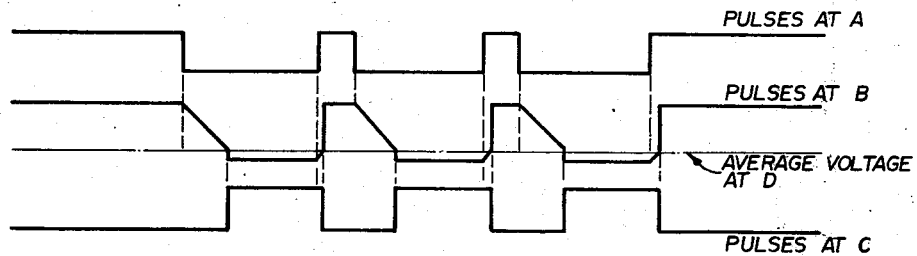
FIG. 3 is an illustration of the corrective action of the circuit in FIG. 1 for too long duration pulses.

The operation of the circuit will now be described with reference to FIGS. 2 and 3 of the drawings. In the averaging circuit 30 shown in FIG. 1, the junction point of the capacitors 35 and 36 and the resistor 37 and 38 is connected to ground as a reference potential. This is so because the incoming pulses at point A as shown in FIGS. 2 and 3 swing about ground potential. If for any reason the incoming pulses at A are superposed on a d-c potential, as may be the case in certain applications, then a reference voltage equal to that d-c potential should be utilized as the reference potential instead of ground. For instance, the incoming pulses may swing between −48 volts and ground. In that case the reference potential in the averaging circuit 30 would be at midpoint of the voltage swing of the pulses or −24 volts.

Turning now to FIG. 2, it is seen that the incoming pulses at A are too short in duration. Due to this fact, and to the fact that the pulses are negative going, the capacitor 36, via diode rectifier 34, accumulates less charge than the capacitor 35, which is being charged via the diode 33 by the positive going pauses between pulses, since the pauses are longer than the pulse. As a result, the resistor 37 develops more voltage across than that developed across the resistor 38. The potential of the wiper of the potentiometer 39, therefore, becomes more positive and so the threshold voltage (comparison voltage) at D, i.e. the non-inverting input 12 of the comparator 10, is now more positive. This is indicated in FIG. 2 by the straight line representing the threshold voltage at D. Due to the longer discharge time taken by the capacitor 16, before the transistor 18 shorts the resistor 15, the inverted output pulse at C lasts longer than the corresponding input pulse at A. Because the input pulses at A are directed to the inverting input 11 of the comparator 10, the output pulses at C are inverted. Usually the pulse rejection circuit, such as that disclosed in U.S. Pat. No. 3,822,385, precedes the present circuit and also causes an inversion, so that the end result at point C of the present circuit is the non-inverted corrected replica of the original input pulses. However, pulse inversion as such does not pose any problem, as those skilled in the art will immediately recognize. Nothing is simpler than an inverting stage to reinvert the pulses, if necessary.

The case of incoming pulses that are too long in duration is explained in FIG. 3. In that case the resistor 38 develops more voltage across than does the resistor 37, and hence the wiper of the potentiometer 39 becomes less positive (or more negative). The charging of the capacitor 16 is cut short by the switching action of the comparator 10 at its output 13, which causes the transistor 20 to short the discharge resistor 15. As a result the pulse duration at C is reduced. The action, of course, is similar to, but in its effect opposite, that described in conjunction with FIG. 2.

Now if every component in the circuit had close tolerances and the reference potential (i.e. ground in FIG. 1) was exactly at mid-point of the pulse amplitude, the potentiometer 39 would not be necessary. Instead, one would have two equal resistors the centre of which is tapped by the point D. The potentiometer 39, therefore, permits compensation of limited asymmetries in component values or an inaccuracy in reference potential.

The correction circuit, in fact, would also function without the switching transistors 18 and 20 and associated components (i.e. diodes 17 and 19 and resistors 21 and 22). However, the range of correction would be limited. For instance, as indicated in FIG. 2 by dotted tracings at the first pulse at B, the discharge of the capacitor 16 would continue beyond the point of intersection with the average voltage and begin recharging at the occurrence of the trailing edge of the first incoming pulse at point X. At the time of intersection of the charge curve with the average voltage at point Y, the comparator would switch and a shorter output pulse at C would result as indicated under point Y. In other words, the circuit would not correct pulses within the range of ca.10% to 90% of the pulse repetition period, as the full correction circuit shown in FIG. 1 would. Clearly, in certain limited applications such a reduced circuit may be sufficient. In that event, also, the inputs 11 and 12 of the comparator 10 may be interchanged to yield non-inverted output pulses, if that is desired.

Typical values for components in the circuit of FIG. 1, as utilized to correct standard telephone dial pulses, are as follows:

Resistors

15 = 56 Kohm
21, 22 = 300 Kohm
31 = 16 Kohm
32 = 24 Kohm
37, 38 = 510 Kohm
39 = 10 Kohm Capacitors 16 = 0.47 microfarad
35, 36 = 1.0 microfarad The resistors 31 and 32 do not have equal value, because in conventional telephone systems in North America the standard is a 60% break (i.e. pause) between dial pulses. Therefore, the nominal duration for the pulses should be 40% of the pulse repetition period, and the averaging circuit is deliberately asymmetrical in favour of the positive potential (i.e. the rectified average of the incoming pulses is offset by a positive potential). As will be noticed, the ratio of the resistors 31 and 32 is 16:24 or 40:60.

What is claimed is:

1. A pulse duration correcting circuit comprising: a comparator having two inputs, a predetermined one receiving incoming pulses through resistive circuit means, and the other receiving the incoming pulses through a bipolar averaging circuit; the output of said comparator being the output of the pulse correcting circuit; and said resistive circuit means comprising two switching transistors of opposite polarity shunted to a resistor connecting the incoming pulses with said one predetermined input of said comparator, and said switching transistors being controlled at their electrodes by the output of said comparator.

2. The pulse duration correcting circuit defined in claim 1, the input receiving the incoming pulses through resistive circuit means having integrating circuit means shunted thereto.

3. The pulse duration correcting circuit defined in claim 2, said bipolar averaging circuit comprising an input terminal receiving said incoming pulses, a first resistor connected between said input terminal and a first diode, a second resistor connected between said input terminal and a second diode, oppositely poled with respect to said first diode, said first and second diodes having two fixed terminals of a potentiometer connected between their remaining electrodes, and two pairs of a resistor and a capacitor in parallel connecting each of said two fixed terminals to a reference potential, the variable terminal of said potentiometer (wiper) being the output of said bipolar averaging circuit and being connected to said other input of said comparator.

4. The pulse duration correcting circuit defined in claim 3, said two switching transistors each having in series a diode poled to conduct when its associated transistor conducts.

5. A pulse duration correcting circuit for adjusting the duration of incoming dial pulses to a predetermined value comprising: a comparator having a first inverting input, a second non-inverting input, and an output coincident with the output of said circuit; said first input having shunted thereto capacitive circuit means and having said incoming dial pulses conducted thereto by means of switched resistive circuit means; means for supplying said second input with a rectified average of said incoming dial pulses offset by a predetermined potential; and said switched resistive circuit means being a resistor having shunted thereto the conductor paths of an NPN and a PNP transistor, the bases of which are controlled by the output of said circuit.

6. The pulse duration correcting circuit as defined in claim 5, said rectified average of said incoming dial pulses being adjustable before application to said second input.

7. The pulse duration correcting circuit as defined in claim 6, said NPN and PNP transistors having their emitter connected to the terminal of said resistor receiving said incoming dial pulses via a diode poled in the same sense as the base-emitter junction of the respective transistor.

* * * * *